March 15, 1966 H. FISCHLER 3,241,083

NOISE IMPROVEMENTS IN TRANSISTORS

Filed July 20, 1961

INVENTOR.
HENRYK FISCHLER

BY

OSTROLENK, FABER, GERB & SOFFEN

ATTORNEYS

United States Patent Office 3,241,083 Patented Mar. 15, 1966

3,241,083

NOISE IMPROVEMENTS IN TRANSISTORS

Henryk Fischler, Tel-Aviv, Israel, assignor to The Weizmann Institute of Science, Rehovoth, Israel Filed July 20, 1961, Ser. No. 125,582
1 Claim. (Cl. 330—40)

My invention relates to D.-C. bias networks, and more particularly for low level transistor amplifier stages when high input impedance is required.

As is well known, the noise figure, i.e., the ratio of noise to signal level *N/S* of the entire amplifier is a function of the noise engendered in the input of the first stage of the amplifier. In such a case, the noise obtains the same ratio of gain as does the desired signal.

It is accordingly desirable to reduce the noise at the input of the first stage in order to maintain the smallest *N/S* ratio.

Noise, created by the transistor itself, is also produced by resistors used in the amplifier. Present commercially available resistors of high values are of carbon composition or film types and generate noise not only of resistance thermal character (Johnson noise), but also arising from the "resistance fluctuation." This second kind of noise occurs when current flows through the resistor and among other features it increases with increasing resistance and with increased load current. Resistors, however, are essential for providing the required bias potentials at the electrodes of the transistors as well as the necessary high impedance for large gain of the amplifier.

I have discovered a network arrangement by which I can achieve both high impedance and the necessary bias potentials with substantially less resistances than has heretofore been required.

Accordingly, an object of my invention is to provide a novel circuit arrangement for providing bias potentials.

Another object of my invention is to provide a novel bias networks having components of relatively low resistance.

Still a further object of my invention is to provide a novel low noise transistor amplifier having large input impedance.

These and other objects of my invention will become evident from the following drawings in which.

Figure 1:
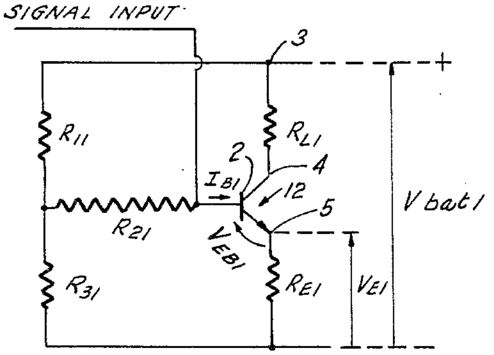
FIGURE 1 is a circuit diagram of one embodiment of my invention.
Figure 2:
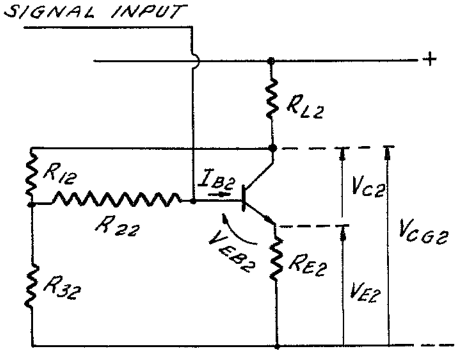
FIGURE 2 is a circuit diagram showing an alternate embodiment of my invention.

Referring to FIGURES 1 and 2, my novel bias networks have one common relatively large resistor $R_{21}$ (FIGURE 1) and $R_{22}$ (FIGURE 2) for the forward and reverse bias paths, and two relatively small resistors $R_{11}$, $R_{31}$ (FIGURE 1) and $R_{12}$, $R_{32}$ (FIGURE 2) each in one of the bias paths, enabling the control of the working point of the transistor, together with the possibility of reversing the direction of the bias current and the control of degree of D.-C. bias stability, as in the conventional bias networks.

Figure 3:
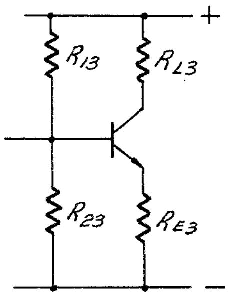
FIG. 3 PRIOR ART
FIGURES 3 and 4 show conventional prior art circuit diagrams.
Figure 4:
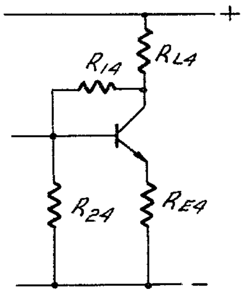
FIG. 4 PRIOR ART

In the prior art shown in FIGURE 3, two relatively large resistors $R_{13}$ and $R_{23}$ are connected as a voltage divider. The voltage at the junction of $R_{13}$ and $R_{23}$ is determined by the ratio of these resistors and is applied as the bias voltage to the base of the transistor.

The desired ratios of resistors may be obtained over almost any range of resistance value. However, in order to achieve a high input impedance, the resistors $R_{23}$ and therefore $R_{13}$ are made relatively large.

Such large resistors necessarily mean large noise factors which are undesirable.

I have discovered that by separating the functions of the resistors to provide bias on the one hand, and to provide high input impedance, on the other hand, I can achieve both the required high input impedance and the required bias with much smaller values of resistors.

In accordance with this novel principle, the two resistors $R_{11}$ and $R_{31}$ (FIGURE 1) are connected as a voltage divider in substantially the same ratio relation as the resistors $R_{13}$ and $R_{23}$ in FIGURE 3. There is however this basic difference, i.e. the resistors 13 and 23 FIGURE 3 are relatively larger resistors whereas $R_{11}$ and $R_{31}$ are relatively small resistors.

However, such low resistors by themselves do not provide the necessary high input impedance. To provide this, a relatively large resistor $R_{21}$ FIGURE 1 extends from the junction of $R_{11}$ and $R_{31}$ to the base electrode 2 of the transistor.

In FIGURE 1, a resistor $R_{L1}$ extends between one side 3 of source of power and the collector electrode 4 of a transistor 12 and a resistor $R_{E1}$ extends between the emitter 5 of transistor 12 and the other side of the source of power.

By proper design, the values of $R_{11}$, $R_{31}$ and $R_{21}$ can be so predetermined that the required bias voltage is obtained at net resistance value less than that required in FIGURE 3 for $R_{13}$ and $R_{23}$ in a transistor amplifier having high input impedance.

The common and relatively larger resistor $R_{21}$ which provides high impedance is chosen close to the value of the resulting bias resistance desired in order to obtain the optimal values of the other two resistors $R_{11}$ and $R_{31}$.

The value for $R_{11}$ is computed from the equation:

$$R_{11}=\frac{V_{\text{bat }1}(R_{\text{res }1}-R_{21})}{I_{B1}\cdot R_{\text{res }1}+(V_{EB1}+V_{E1})} \quad (1)$$

The value for $R_{31}$ is computed from the equation:

$$R_{31}=\frac{V_{\text{bat }1}(R_{\text{res }1}-R_{21})}{V_{\text{bat }1}-[I_{B1}\cdot R_{\text{res }1}+(V_{EB1}+V_{E1})]} \quad (2)$$

In these equations:

$$R_{\text{res }1}=R_{21}+\frac{R_{11}\cdot R_{31}}{R_{11}+R_{31}} \quad (3)$$

and $V_{\text{bat }1}$ is the voltage of the bias voltage supply; $R_{21}$ is the resistance in the current path $I_{B1}$; $V_{EB1}$ is the emitter-to-base voltage and $V_{E1}$ the voltage appearing across the resistor $R_{E1}$.

The network of FIGURE 2 may similarly be determined by a resistor value for $$R_{12}=\frac{V_{CG2}(R_{\text{res }2}-R_{22})}{I_{B2}\cdot R_{\text{res }2}+(V_{EB2}+V_{E2})} \quad (4)$$

$$R_{32}=\frac{V_{CG2}(R_{\text{res }2}-R_{22})}{V_{CG2}-[I_{B2}\cdot R_{\text{res }2}+(V_{EB2}+V_{E2})]} \quad (5)$$

after the value of $R_{22}$ has been chosen.

Limitation for the use of the new bias networks are expressed by the formulae for the bias base current, $I_B$ $$-\frac{V_{EB1}+V_{E1}}{R_{\text{res }1}}\leq IB1\leq\frac{V_{\text{bat }1}-(V_{EB1}+V_{E1})}{R_{\text{res }1}} \quad (6)$$

$$-\frac{V_{EB2}+V_{E2}}{R_{\text{res }2}}\leq IB2\leq\frac{V_{C2}-V_{EB2}}{R_{\text{res }2}} \quad (7)$$

where the terms are as designated above and in FIG. 1 and FIG. 2.

Equation 3 expresses the resulting resistance of the bias configuration, including the resistances $R_{11}$, $R_{21}$ and $R_{31}$, which shunts (for alternating current) the input impedance of the transistor itself (as can be seen from FIG. 1).

$$V_{31}=V_{bat\ 1}-I_{11}R_{11}=V_{bat\ 1}-R_{11}(I_{31}+I_{B1})=V_{bat\ 1}-R_{11}\left(\frac{V_{31}}{R_{31}}+I_{B1}\right) \quad (8)$$

$$V_{31}=V_{EB1}+V_{E1}+I_{B1}\cdot R_{21} \quad (9)$$

From Equation 3 above $$R_{31}=\frac{(R_{res\ 1}-R_{21})R_{11}}{R_{11}-(R_{res\ 1}-R_{21})} \quad (10)$$

Substituting successively Equations 10 and 9 into 8, $$R_{11}=\frac{V_{bat\ 1}(R_{res\ 1}-R_{21})}{I_{B1}R_{res\ 1}+(V_{EB1}+V_{E1})} \quad (11)$$

which constitutes the Equation 1 above.

Substituting Equation 11 into 10, we obtain:

$$R_{31}=\frac{V_{bat\ 1}(R_{res\ 1}+R_{21}}{V_{bat\ 1}-[I_{B1}\cdot R_{res\ 1}+(V_{EB1}+V_{E1})]} \quad (12)$$

which constitutes the Equation 2 above.

In a similar manner, from FIG. 2, the Equations 4 and 5 above can be derived:

$$V_{32}=V_{CG2}-I_{12}R_{12}=V_{CG2}-R_{12}(I_{32}+I_{B2})=V_{CG2}-R_{12}\left(\frac{V_{32}}{R_{32}}+I_{B2}\right) \quad (13)$$

$$V_{32}=V_{EB2}+V_{E2}+I_{B2}R_{22} \quad (14)$$

The resulting resistance of the bias configuration (neglecting $R_{12}$ as a relative small component) which shunts the input impedance of the transistor itself.

$$R_{res\ 2}=R_{22}+\frac{K_{12}\cdot R_{32}}{R_{12}+R_{32}} \quad (15)$$

From that $$R_{32}=\frac{R_{12}(R_{res\ 2}-R_{22})}{R_{12}-(R_{res\ 2}-R_{22})} \quad (16)$$

Substituting successively Equations 16 and 14 into 13, we obtain $$R_{12}=\frac{V_{CG2}(R_{res\ 2}-R_{22})}{I_{B2}\cdot R_{res\ 2}+(V_{EB2}V_{E2})} \quad (17)$$

which constitutes the Equation 4 above.

Substituting Equation 17 into 16, we obtain $$R_{32}=\frac{V_{CG2}(R_{res\ 2}-R_{22})}{V_{CG2}-[I_{B2}R_{res\ 2}+(V_{EB2}+V_{E2})]} \quad (18)$$

which constitutes the Equation 5.

The Equations 1 and 2 have a real meaning for positive denominators only. Thus $$I_{B1}\cdot R_{res\ 1}+(V_{EB1}+V_{E1})\geqslant 0 \quad (19)$$

$$V_{bat\ 1}-[I_{B1}R_{res\ 1}+(V_{EB1}+V_{E1})]\geqslant 0 \quad (20)$$

Bringing down $I_{B1}$ from Equations 19 and 20 and taking those together, the Equation 6 is obtained.

Similarly, the Equations 4 and 5 have a real meaning for positive denominators only. Thus $$I_{B2}\cdot R_{res\ 2}+(V_{EB2}+V_{E2})\geqslant 0 \quad (21)$$

$$V_{CG2}-[I_{B2}\cdot R_{res\ 2}+(V_{EB2}+V_{E2})]\geqslant 0 \quad (22)$$

Bringing down $I_{B2}$ from Equations 21 and 22 and taking those together, the Expression 7 is obtained $$(V_{C2}=V_{CG2}-V_{E2}$$

as it can be seen from FIG. 2).

Practically the working point for the low noise high input impedance stage can always be chosen in these limits, the supply voltage being here the significant factor.

Examples of such values are as follows:

To obtain the resultant resistance of the bias network of about 500 kilohms in a particular transistor stage in the collector-grounded configuration ($R_L=0$), working at collector current $Ic=0.07$ ma. and collector-to-emitter voltage $V_{CE}$ of 1.2 v., at 2.6 v. supply voltage:

For the conventional bias network, resistance values used are:

$R_{13}$ (and $R_{14}$)=1.8 megohm, leading 0.7$\mu$a.
$R_{23}$ (or $R_{24}$)=680 kilohm, leading 2.1 $\mu$a.

For the new bias network $R_{11}$ (and $R_{12}$)=82 kilohm, leading 20 $\mu$a.
$R_{31}$ (and $R_{32}$)=39 kilohm, leading 21.5 $\mu$a.
$R_{21}$ (and $R_{22}$)=470 kilohm, being the main factor of noise, leading 1.5 $\mu$a. It will be noted here that the current flow in $R_{21}$ is exceedingly small.

In the same circuits, also of 500 kilohms resultant resistance of the bias network working at $I_C=0.1$ ma., $V_C=0.8$ v. at 2.6 v. supply;

For the conventional bias network are used $R_{13}$ (or $R_{14}$)=1 megohm, leading 0.8 $\mu$a.
$R_{23}$ (or $R_{24}$)=1 megohm, leading 1.8 $\mu$a.

For the new bias network $R_{11}$ (or $R_{12}$)=56 kilohm, leading 23 $\mu$a.
$R_{31}$ (or $R_{32}$)=56 kilohm, leading 24 $\mu$a.
$R_{21}$ (or $R_{22}$)=470 kilohm, being the main factor or noise, leading 1 $\mu$a.

From the above, it will now be clear that the improvement of the new bias networks consists of enabling the use, at the same operating point of the transistor, as for a conventional network, of bias resistors of smaller values to achieve almost the same resulting resistance of the bias network. Therefore the same degree of D.-C. bias stability and the same input impedance of the stage, both being dependent on the resulting resistance of the bias network are obtained as in the conventional circuit. The bias resistors of smaller values contribute in their final configuration to lower noise arising from the "resistance fluctuations." Also the current flowing through the big common resistor, being yet the main source of noise, is smaller than that which would flow in one of the bigger resistors in the conventional circuit, and so the noise from this resistor is smaller. As a result, the over-all noise from the input of the stage is smaller than for a stage with the equivalent (as regarding working point, degree of D.-C. bias stability and input impedance) conventional bias network.

Figure 5:
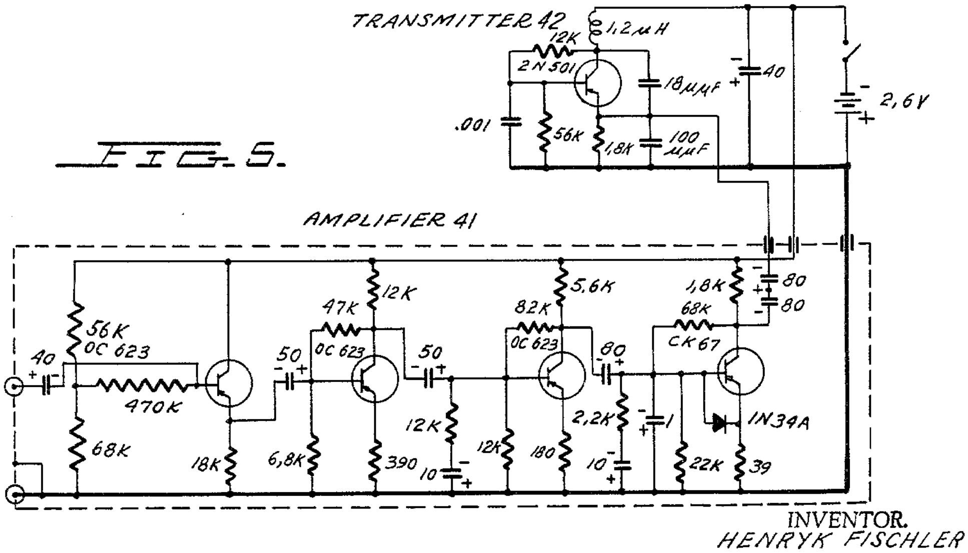
FIGURE 5 is a circuit diagram showing my novel network applied to an amplifier transmitter system.

In FIGURE 5, I have an amplifier circuit in which the novelty bias network is shown in one application thereof. As shown, the novel networks connected on the input of the first stage of the amplifier reduces the noise factor of this stage and thus reduces the total noise. The output of the amplifier is connected to the transmitter in conventional manner.

In FIGURE 5, an actual circuit with values as used in one embodiment is shown. The amplifier 41 is shown with the voltage dividers and high impedances corresponding to R31, R11 and R21 of FIGURE 1. The input at 40 is connected directly to the base electrode of the transistor. Output signals from amplifier 41 are impressed across and modulate signals from the oscillator and then are transmitted by transmitter 42.

I claim:

In a transistor circuit, a source of bias potential, a voltage divider resistor network comprising a pair of resistors connected across said source of bias potential, a transistor having an input base electrode, an input circuit connected directly to said input base electrode, said transistor further having an emitter electrode which includes an emitter resistance connecting said emitter to said bias source, the ratio of the respective resistance values of said pair being determined in accordance with the desired bias potential and a resistance of relatively large value with respect to the value of each of said pair of resistances extending from the junction of said resistors of said voltage divider network to the input electrode of said transistor, said resistance of relatively large value being chosen close to the desired value of the resulting bias resistance which includes the said pair of resistors and said resistor of relatively large value to obtain optimal values of each of said pair of resistors, and the values of the resistance of the voltage divider being chosen in accordance with the equations:

$$R_{11}=\frac{V_{bat\ 1}(R_{res\ 1}-R_{21})}{I_{B1}\cdot R_{res\ 1}+(V_{EB1}+V_{E1})} \quad (1)$$

$$R_{31}=\frac{V_{bat\ 1}(R_{res\ 1}-R_{21})}{V_{bat\ 1}-[I_{b1}\cdot R_{res\ 1}+(V_{EB1}+V_{E1})]} \quad (2)$$

where:

$$R_{res\ 1}=R_{21}+\frac{R_{11}\cdot R_{31}}{R_{11}+R_{31}} \quad (3)$$

and where $R_{11}$ and $R_{31}$ are the resistors of the voltage divider, $V_{bat\ 1}$ is the voltage of said source of bias voltage, $R_{21}$ is the value of resistance of said relatively large resistance, $I_{B1}$ is the value of current flowing through said large resistance, $R_{res\ 1}$ is the resulting bias resistance, $V_{EB1}$ is the voltage between the base and emitter electrodes of said transistor, and $V_{E1}$ is the voltage across said emitter resistance and in which circuit the limitation for use of said network is in accordance with the equation:

$$\frac{V_{EB1}+V_{E1}}{R_{res\ 1}}\leq I_{B1}\leq\frac{V_{bat\ 1}-(V_{EB1}+V_{E1})}{R_{res\ 1}} \quad (4)$$

whereby a reduction of noise level is produced.

References Cited by the Examiner

UNITED STATES PATENTS 3,116,447 12/1963 Barter.

OTHER REFERENCES

MacDougall: Equations Speed Common Emitter Bias Design, Raytheon, File No. 154–T, December 1960.

Martin: Electronic Circuits, Prentice-Hall, Inc. 1955, sec. 9.13, pages 325, 244, Figure 9.9, Equation 9.36.

ROY LAKE, *Primary Examiner.*

ARTHUR GAUSS, NATHAN KAUFMAN, *Examiners.*